United States Patent
Bi

(10) Patent No.: US 6,408,418 B1
(45) Date of Patent: Jun. 18, 2002

(54) REDUCED-STATE DEVICE AND METHOD FOR DECODING DATA

(75) Inventor: Qi Bi, Morris Plains, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/181,811

(22) Filed: Oct. 29, 1998

(51) Int. Cl.[7] ............................................. H03M 13/03
(52) U.S. Cl. ...................................................... 714/786
(58) Field of Search ............................ 714/786, 795–6, 714/792, 789, 793; 375/261, 262, 265, 341; 455/517, 343; 340/7, 38; 704/254, 256; 700/34

(56) References Cited

U.S. PATENT DOCUMENTS

| | | | | | |
|---|---|---|---|---|---|
| 5,263,033 A | * | 11/1993 | Seshadri | ..................... | 714/792 |
| 5,307,374 A | * | 4/1994 | Baier | ......................... | 375/229 |
| 5,390,198 A | * | 2/1995 | Higgins | ...................... | 714/796 |
| 5,483,236 A | * | 1/1996 | Bi | ............................... | 714/786 |
| 5,550,870 A | * | 8/1996 | Blaker et al. | ................ | 375/341 |
| 5,557,639 A | * | 9/1996 | Heikkila et al. | ............ | 375/224 |
| 5,784,392 A | * | 7/1998 | Czaja et al. | ................. | 714/786 |
| 5,796,757 A | * | 8/1998 | Czaja | ......................... | 714/789 |
| 5,905,742 A | * | 5/1999 | Chennakeshu et al. | ..... | 375/222 |
| 5,983,180 A | * | 11/1999 | Robinson | ..................... | 704/254 |
| 5,991,635 A | * | 11/1999 | Dent et al. | .................. | 455/517 |
| 6,081,562 A | * | 6/2000 | He et al. | ..................... | 375/341 |

OTHER PUBLICATIONS

Chan, et al.(IC Design of an Adaptive Viterbi Decoder. IEEE, 1995).*
Anderson, et al.(Reduced–State Sequnece Detection with Convolutional Codes.IEEE, 1994).*
Zhang, et al.(Reduced State Computation of Distance Spectrum for Certain Optimal Convolutional Codes. IEEE, 1993).*
Fitz, et al.(Reduced Complexity Symbol–By–Symbol Soft Output Algorithms. IEEE, 1996).*

* cited by examiner

Primary Examiner—Albert Decady
Assistant Examiner—Guy Lamarre
(74) Attorney, Agent, or Firm—Harness, Dickey & Pierce, P.L.C.

(57) ABSTRACT

A method and device for decoding data. The device and method select certain current states from all possible states of an encoder for each of encoded data, generate accumulated conditional probabilities (ACPS) for the selected current states, compare the ACPs with a threshold value, and store previous states associated with the ACPs based on the comparison results. The stored previous states are selectively output according to a predetermined scheme to generate decoded data.

49 Claims, 6 Drawing Sheets

|  | C0 | C1 | C2 | C3 | ... | C192 | C193 | C194 | C195 |
|---|---|---|---|---|---|---|---|---|---|
| R0 |  |  |  |  |  |  |  |  | 3 |
| R1 |  |  |  |  |  |  | 255 |  |  |
| R2 |  |  |  |  |  |  |  |  |  |
| R3 |  |  |  |  |  |  |  | 1 |  |
| ⋮ |  |  |  |  |  |  |  |  |  |
| R255 |  |  |  |  |  | 72 |  |  |  |

FIG. 8A

| | C0 | C1 | C2 | C3 | C4 | ... | C191 | C192 | C193 | C194 | C195 |
|---|---|---|---|---|---|---|---|---|---|---|---|
| R0 | 0 | 0 | 0 | 0 | 0 | | | | | -1 | 0 |
| R1 | 128 | 1 | 2 | 4 | 8 | | | | | 0 | 1 |
| R2 | -1 | 0 | 1 | 2 | 4 | | | -1 | 64 | 128 | 0 |
| R3 | -1 | 1 | 3 | 6 | 12 | | 144 | | | 4 | 9 |
| R4 | -1 | | | 1 | 2 | | | | | 1 | 2 |
| R5 | | | | 3 | | | 144 | 32 | 64 | | |
| ⋮ | | | | | | | | | | | |
| R63 | -1 | | | | | | | | | | |

FIG. 8B

| | CC0 | CC1 |
|---|---|---|
| RR0 | -2 | 0 |
| RR1 | -2 | 4 |
| RR2 | -2 | 2 |
| RR3 | -2 | 5 |
| RR4 | -2 | 1 |
| RR5 | -2 | 6 |
| RR6 | -2 | 3 |
| RR7 | -2 | 7 |
| RR8 | | -1 |
| RR9 | | -1 |
| RR10 | | |
| RR11 | | |
| RR12 | | |
| RR13 | | |
| ⋮ | | |
| RR253 | | -1 |
| RR254 | | -1 |
| RR255 | | -1 |

FIG. 8C

| | CC0 | CC1 |
|---|---|---|
| RR0 | | 0 |
| RR1 | | 4 |
| RR2 | | 2 |
| RR3 | | 5 |
| RR4 | | 1 |
| RR5 | | 6 |
| RR6 | | -2 |
| RR7 | | 7 |
| RR8 | | |
| RR9 | | |
| RR10 | | |
| RR11 | | |
| RR12 | 3 | |
| RR13 | | |
| ⋮ | | |
| RR253 | | |
| RR254 | | |
| RR255 | | |

REDUCED-STATE DEVICE AND METHOD FOR DECODING DATA

BACKGROUND OF THE INVENTION

1. Field of the Invention

The present invention relates to a device and method for decoding data and, more particularly, to a reduced-state device and method for decoding data by generating accumulated conditional probabilities (ACPs) for certain states out of all possible states of an encoder.

2. Description of Related Art

A conventional convolutional encoder encodes information bits using a shift register and a plurality of adders. FIG. 1 shows a schematic diagram of a conventional ½ rate convolutional encoder. As shown therein, the conventional convolutional encoder 100 includes a shift register 11 composed of a plurality of memory units M0–M7 connected in series to each other, and first and second adders 10 and 12 coupled to the shift register 11 for generating first and second coefficients C0 and C1. Each of the memory units M0–M7 is a one-bit memory for storing a bit input thereto while shifting the bit already stored therein to a next one-bit memory.

Since there are 8 one-bit memory units M0–M7 in the shift register 11, the shift register 11 has 256 possible states (from state 0 to state 255). The term "state" indicates the content of the shift register 11 at a given time. It is known that the state of the shift register 11 is an even state if the arriving information bit (i.e., the bit ready to be input to the first memory unit M0) of the previous state of the shift register 11 is zero, or an odd state if the arriving information bit of the previous state of the shift register 11 is one.

An operation of the conventional convolutional encoder 100 of FIG. 1 is as follows. Information bits to be encoded are input to the first memory unit M0 one bit at a time. A block of information bits (e.g., 196 bits) are typically processed at one time. Each new information bit input to the encoder 100 is pushed into the first memory unit M0 of the shift register 11 as the previous content of the first memory unit M0 is shifted to the second memory unit M1, the previous content of the second memory unit M1 to the third memory unit M2, the previous content of the third memory unit M2 to the fourth memory unit M3, and so forth. A controller (not shown) generates a clock signal to shift the bits of the memory units M0–M7 at a predetermined time interval.

The first adder 10 adds the arriving information bit of the shift register 11 with bits stored in the memory units M0, M1, M2, M4, M6, and M7 to generate the first coefficient C0. The second adder 12 adds the arriving information bit with bits stored in the memory units M1, M2, M3 and M7 to generate the second coefficient C1. According to this process, as one bit of information data is input to the encoder 100, a pair of coefficients C0 and C1 are output from the encoder 100 as encoded data. Hence, the encoder 100 has the ½ process rate. Although the conventional ½ rate convolutional encoder 100 has been described above, encoders having other process rates, e.g., ⅓, ⅔, and others, are also known in the art.

The first and second coefficients C0 and C1 (encoded data) generated by the encoder 100 pass through communication channels to other encoders/decoders. During this process, however, the encoded data suffer from bit corruption and become less reliable. For example, as the encoded data pass through communication channels, certain zero ("0") bits may change to one ("1") bits and vice versa, such that corrupted coefficients CC0 and CC1 are transmitted as encoded data, and are decoded by a conventional convolutional decoder.

To decode the corrupted coefficients CC0 and CC1, a conventional convolutional decoder assumes all possible states of the shift register 11 of the encoder 100, and attempts to determine what the original, uncorrupted coefficients C01 and C1 are. If the original coefficients C0 and C1 output from the encoder 100 can be determined, then accurate input data (i.e., arriving information bits of the encoder 100) can be recovered as decoded data.

Figure 2A:
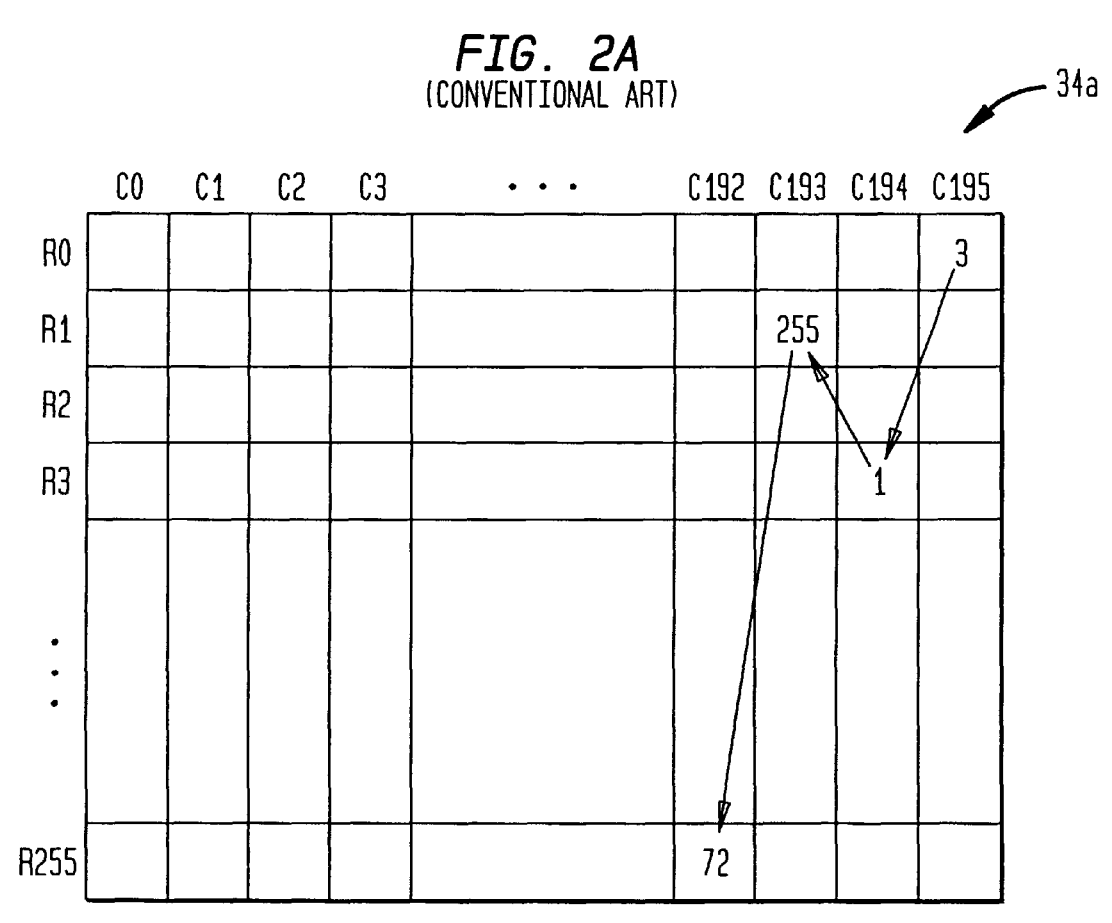

FIG. 2 shows a block diagram of such a conventional convolutional decoder 200 for decoding encoded data, such as, corrupted coefficients CC0 and CC1. The decoder 200 includes a state counter 20, a previous state locator 22, first and second encoders 24A and 24B, a modulo 2 unit 26, first and second quantizers 28A and 28B, first and second adders 30A and 30B, a maximum selector 32, a memory unit 34, and a decoding unit 36, connected as shown.

The state counter 20 counts from state 0 to state 255 for each pair of the corrupted coefficients CC0 and CC1 to cover all 256 possible states of the shift register 11 in the conventional encoder 100. The state counting by the state counter 20 is performed based on a clock signal generated from the memory unit 34. Based on each current state count value, the previous state locator 22 determines two possible previous states (i.e., two possible contents of the memory units M0–M7 of the shift register 11 shown in FIG. 1) according to a known process. One of the two possible previous states is output to the first encoder 24A, and the other possible previous state is output to the second encoder 24B.

The modulo 2 unit 26 receives the state count value from the state counter 20, and generates 0 or 1 based on each state count value. The 0 and 1 output from the modulo 2 unit 26 represent possible information bits (0 and 1) to be recovered by the decoder 200.

Each of the first and second encoders 24A and 24B receives the bit from the modulo 2 unit 26 and one of the two possible previous states determined by the previous state locator 22 to generate theoretical coefficients TC0 and TC1. For each input to the first and second encoders 24A and 24B, the first encoder 24A generates a pair of first theoretical coefficients TC0 and TC1, and the second encoder 24B generates a pair of second theoretical coefficients TC0 and TC1. This process is repeated for each of the 256 possible states, so that 256 pairs of theoretical coefficients TC0 and TC1 are sequentially output from each of the first and second encoders 24A and 24B.

Each of the first and second quantizers 28A and 28B receives a pair of the theoretical coefficients TC0 and TC1 for each state count value, and encoded data bits (pairs of corrupted coefficients CC0 and CC1) input to the decoder 200. Each of the first and second quantizers 28A and 28B determines, assuming that uncorrupted coefficients C0 and C1 are input to the decoder 200, the conditional probability of each pair of the corrupted coefficients CC0 and CC1 based on the sequentially received pairs of theoretical coefficients TC0 and TC1, and then quantizes the conditional probability into a certain number of levels, e.g., 32 or 64 levels. The quantized values output from each of the first and second quantizers 28A and 28B indicate how well each pair of inputted corrupted coefficients CC0 and CC1 match the 256 pairs of theoretical coefficients TC0 and TC1. Accordingly, the conventional convolutional decoder 100 carries out a full search algorithm by determining conditional probabilities for the entire 256 possible states of the encoder 100.

Whenever a quantized value is output from the quantizers 28A and 28B, each of the first and second adders 30A and 30B adds the current quantized value with the corresponding accumulated quantized value (i.e., ACP) stored in the memory unit 34 to generate updated ACPs. The maximum selector 32 receives two ACPs from the adders 30A and 30B at a given time, compares the two ACPs to each other, and selects the greater one of the two ACPs. The selected ACP is referred to hereinafter as the winning ACP, and the previous state which results in the winning ACP is referred to hereinafter as the winning previous state (PS). The winning ACP and PS are output to the memory unit 34 unit, where the winning ACP replaces the ACP currently stored in a data slot of the memory unit 34 corresponding to the current state count value.

If a block of 196 information bits are processed at one time by the encoder 100, the memory unit 34 must store 0 to 255 possible ACPs and their corresponding PSs for each of the 196 information bits, and must update all 256 ACPs using the outputs of the maximum selector 32. To carry out this process and the process by the decoding unit 36, the memory unit 34 requires a 256×196 memory array for storing winning PSs in addition to other memory arrays for storing winning ACPs. FIG. 2A shows an example of a 256×196 memory array 34a of the memory unit 34 for storing winning PSs. As shown therein, the memory array 34a of the memory unit 34 is composed of 256 rows (R0–R255) and 196 columns (C0–C195). Each row number represents the current state value and each column number represents a bit in the 196 information bits. For each information bit (i.e., for each column), the memory unit 34 stores in its array 34a the PSs corresponding to the entire 256 possible states. For example, if the current state is zero (i.e., R0), the $196^{th}$ information bit is being decoded by the decoder 200, and the winning PS for this particular current state has been determined to be three (3) by the maximum selector 200, then the wining PS of 3 is stored in a data slot (R0, C195) of the array 34a.

Once all the slots in the array 34a are filled, the decoding unit 36 begins to recover the original information bits using the array 34a. The decoding unit 36 first retrieves the winning PS of 3 from the slot (R0, C195) of the array 34a. Since the winning PS equals 3, the decoding unit 36 goes to row R3 in the next column, C194, and retrieves the winning PS of 1 therefrom. Since the winning PS here equals 1, the decoding unit 36 goes to row R1 in the next column, C193, and retrieves the winning PS of 255 therefrom. Since the winning PS now equals 255, the decoding unit 36 goes to row R255 in the next column, C192, and retrieves the winning PS of 62 therefrom. This process is repeated until the last column C0 is searched. As a result of this retrieval process, 196 integers are sequentially collected by the decoding unit 36. Depending on whether each of the 196 integers is an odd number or an even number, zero (0) or one (1) bit is output from the decoding unit 36 as decoded data representing the original 196 information bits.

As discussed above, conventional decoders require a large memory array (e.g., 256×196) for storing PSs for all possible states of an encoder. Often, however, it is economically infeasible to employ such a large memory array in a decoder. Furthermore, as time passes, the size of one data block and the number of possible states tend to increase, requiring a much larger memory. But, even if a large memory can be used in the system, a full search algorithm carried out by the conventional convolutional decoders is extremely time consuming because ACPs must be calculated for all possible states of an encoder.

SUMMARY OF THE INVENTION

The present invention is directed to a reduced-state device and method for decoding data that uses less memory for storing winning previous states (PSs) associated with accumulated conditional probabilities (ACPs) because less ACPs are generated. The reduced-state device and method select only certain current states from all possible states of an encoder for each encoded data based on a control signal, and generate ACPs for the selected current states. For each non-selected current state, a predetermined quantized value (PQV) is output. The ACPs and the PQV are compared with a threshold value. If the ACP/PQV is greater than or equal to the threshold value, a PS associated with such ACP/PQV is stored in a first memory array. A second memory array stores the positional information of the first memory array in which the winning PS is stored. From each column of the first memory array, one of the values stored therein is selected based on the value selected from the previous column. These selected values are converted into a 0 or 1 bit, and the converted data bits are output as decoded data. Accordingly, the present invention generates ACPs only for certain states out of all possible states and thus, requires less memory for storing PSs associated with the ACPs. Furthermore, the present invention provides a faster decoding process since a reduced number of states are searched to generate decoded data.

BRIEF DESCRIPTION OF THE DRAWINGS

The present invention will become more fully understood from the detailed description given hereinbelow and the accompanying drawings which are given by way of illustration only, wherein reference numerals designate corresponding parts in the various drawings and wherein:

FIG. 2A shows an example of a memory array used in the conventional decoder of FIG. 2;

FIG. 8A shows an example of a first memory array of a second memory unit in the decoder of FIG. 3; and FIGS. 8B and 8C show examples of a second memory array of the second memory unit in the decoder of FIG. 3 at two different times.

DETAILED DESCRIPTION OF THE PREFERRED EMBODIMENTS

The following detailed description relates to a decoder and its method for decoding data according to the present invention. In the present device and method, only certain states (e.g., states most likely to occur) are searched among all possible states of an encoding device to reduce the memory size of the decoder and to increase the decoding speed of the decoder. Also, the method of the present invention can be implemented using computers, computer programs, or the like.

An operation and structure of a decoder according to the present invention will be described below referring to FIGS. 3–8B. In this example, the decoder of the present invention decodes encoded data (pairs of corrupted coefficients CC0 and CC1) which have been output from a 8-bit shift register (having 256 possible states) of an encoder, e.g., the shift register 11 shown in FIG. 1. However, the present device and method can be implemented for decoding other encoded data generated using other types of encoders or a shift register of a different size.

Figure 1:
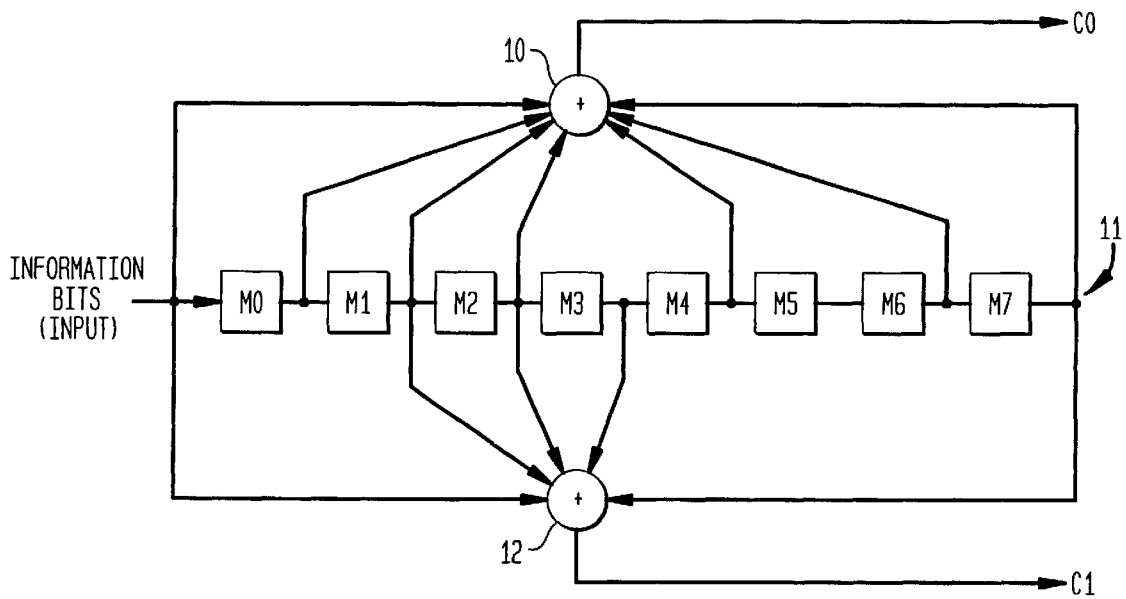
FIG. 1 shows a schematic diagram of a conventional convolutional encoder.
Figure 2:
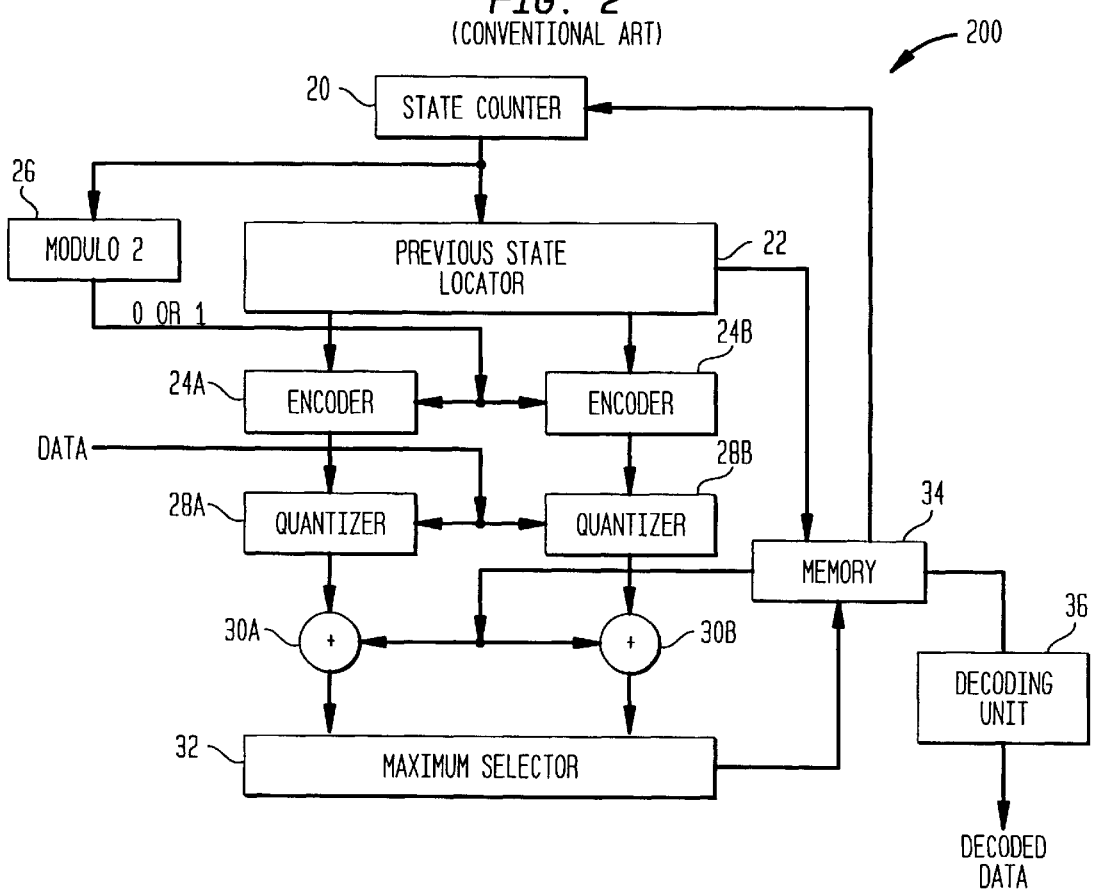
FIG. 2 shows a block diagram of a conventional convolutional decoder.
Figure 3:
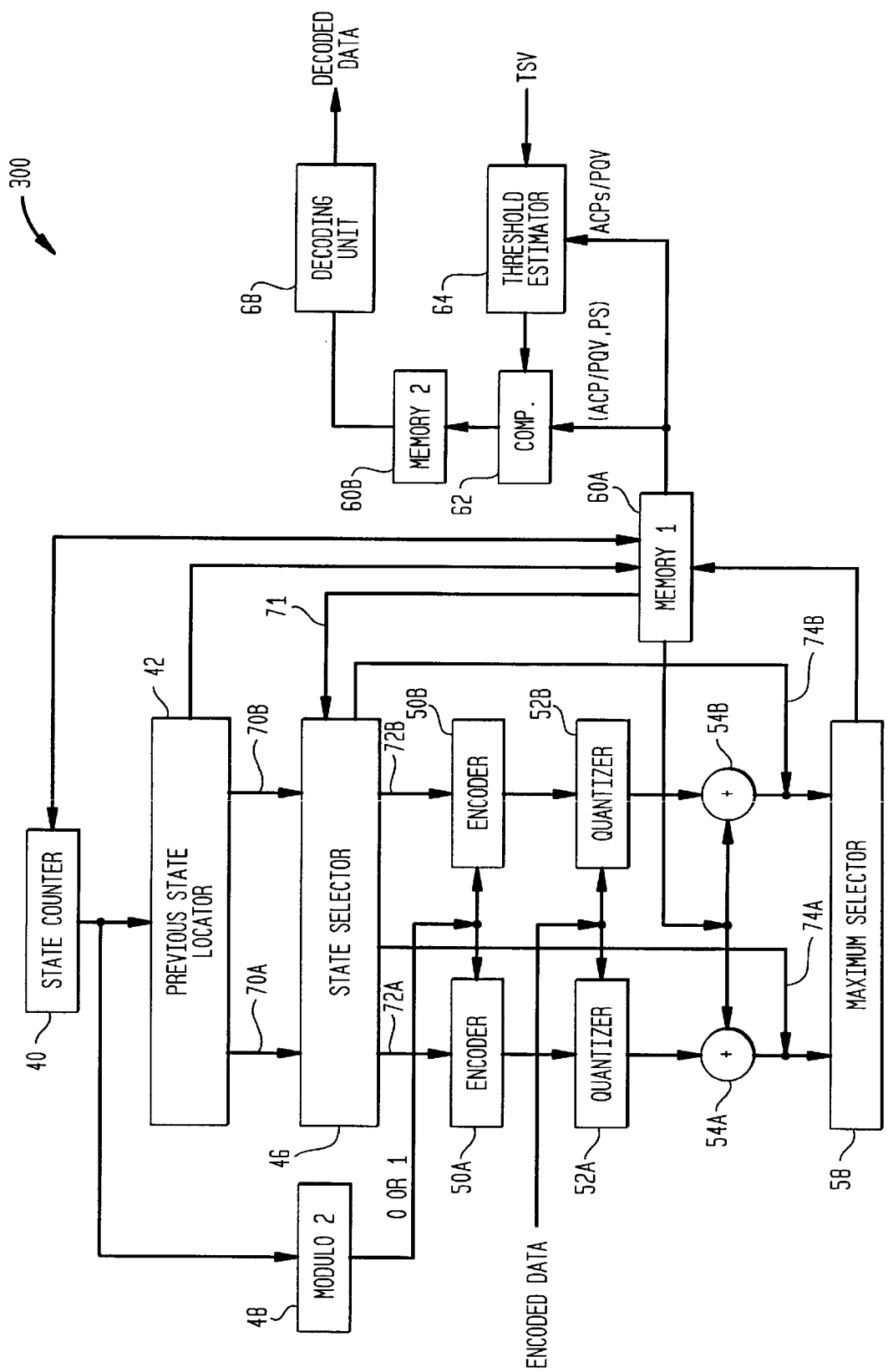
FIG. 3 shows a block diagram of a convolutional decoder according to an embodiment of the present invention.

FIG. 3 shows a block diagram of a decoder 300 according to the present invention. As shown therein, the decoder 300 includes a state counter 40, a previous state locator 42, a state selector 46, a modulo 2 unit 48, a plurality of encoders 50A and 50B, a plurality of quantizers 52A and 52B, a plurality of adders 54A and 54B, a maximum selector 58, a first memory unit 60A, a second memory unit 60B, a comparator 62, a threshold estimator 64, and a decoding unit 68. The state counter 40 can be a shift register known in the art, and the previous state locator 42, the modulo 2 unit 48, the encoders 50A and 50B, the quantizers 52A and 52B, the adders 54A and 54B, and the maximum selector 58 are known elements as shown in FIG. 1.

The state counter 40 counts from possible state 0 to possible state 255 based on a clock signal generated from the first memory unit 60A. The state counter 40 can be a shift register or other counting devices known in the art. Although the state counter 40 counts 256 possible states in this example, a different number of possible states can be counted depending on the size of the encoder, etc. The state counter 40 outputs each state count value to both the modulo 2 unit 48 and the previous state locator 42. For each state count value, the previous state locator 42 determines two possible previous states PS1 and PS2. If a current state is "N" and the total number of possible states is "M", then it is known in the art that the corresponding two possible previous states are "N/2" and "(N+M)/2". For example, if the state counter 40 shifts from state 4 to state 5 and outputs state 5 as the current state count, the previous state locator 42 determines that the two possible previous states corresponding to the current state (state 5) are "state 2" (2≈5/2) and "state 130" (130 ≈(5+256)/2). As in this example, if the division results in a decimal number, the decimal number is rounded down.

Figure 4:
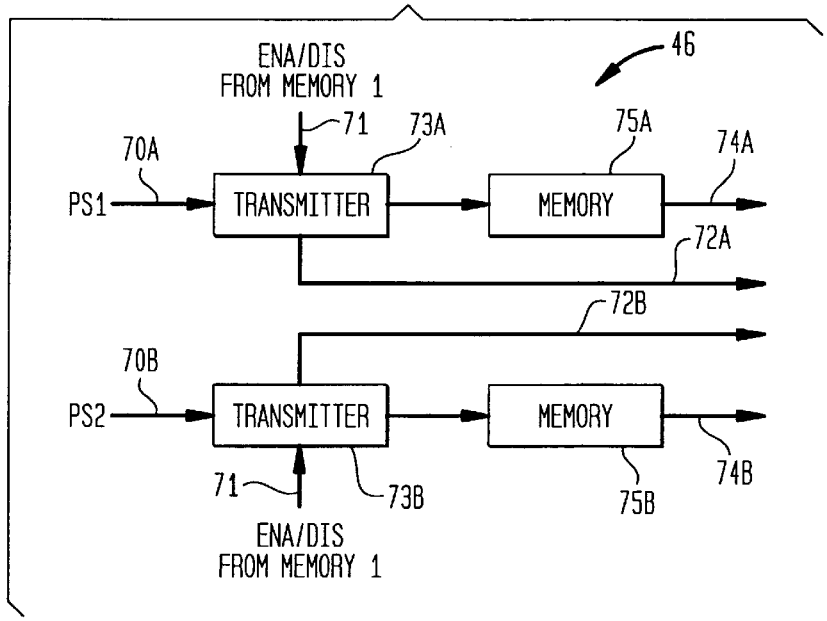
FIG. 4 shows a block diagram of a state selector of the decoder of FIG. 3.

The previous state locator 42 then outputs the two possible previous states PSI and PS2 (e.g., state 2 and state 130) to the state selector 46 through first and second input lines 70A and 70B, respectively. FIG. 4 shows a detailed block diagram of the state selector 46.

As shown in FIG. 4, the state selector 46 includes first and second transmitters 73A and 73B, and first and second memories 75A and 75B connected to the first and second transmitters 73A and 73B, respectively. The first and second transmitters 73A and 73B can be implemented with a collection of logic gates known in the art. The first and second memories 75A and 75B prestore therein one predetermined quantized value (PQV). The PQV can be any value which is different from (preferably lower than) any of ACPs (for 256 states) stored in the first memory unit 60A. In this example, the PQV is a negative number, such as −1, while all ACPs stored in the first memory unit 60A are non-negative numbers. However, other numbers may be used as the PQV according to the present invention.

The state selector 46 receives, through the first and second input lines 70A and 70B, a pair of possible previous states PS1 and PS2 (e.g., state 2 and state 130) for each of the 256 states counted by the state counter 40. An enable signal ENA or a disable signal DIS from the first memory unit 60A is applied simultaneously to both the first and second transmitters 73A and 73B of the state selector 46 through a connection 71.

If the first transmitter 73A receives the enable signal ENA from the first memory unit 60A, the first transmitter 73A transmits the first possible previous state PS1 (e.g., state 2) to the first encoder 50A through a first transmission line 72A. Similarly, as the second transmitter 73B receives the enable signal ENA from the first memory unit 60A, the second transmitter 73B transmits the second possible previous state PS2 (e.g., state 130) to the second encoder 50B through a second transmission line 72B. At the same time, the first and second transmitters 73A and 73B disable the first and second memories 75A and 75B, respectively, so that no data are output from the memories 75A and 75B.

If the first transmitter 73A receives the disable signal DIS from the first memory unit 60A, the first transmitter 73A disables the first transmission line 72A and simultaneously enables the first memory 75A in order to output the PQV prestored in the first memory 75A to the maximum selector 58 through a first connection line 74A. At the same time, as the second transmitter 73A receives the disable signal DIS from the second memory unit 60B, the second transmitter 73B disables the second transmission line 72B and simultaneously enables the second memory 75B to output the same PQV prestored in the second memory 75B to the maximum selector 58 through a second connection line 74B.

Therefore, pairs of previous possible states PS1 and PS2 corresponding to certain current states are transmitted from the state selector 46 to the first and second encoders 50A and 50B through the first and second transmission lines 72A and 72B, respectively. The non-selected pairs of previous possible states PS1 and PS2 are discarded by the state selector 46, and instead, the PQV prestored in the memories 75A and 75B is transmitted to the maximum selector 58 through the first and second connection lines 74A and 74B.

The modulo 2 unit 48 receives the state count values from the state counter 40, and generates any odd or even number, e.g., 0 or 1, based on each state count value. For example, the modular 2 unit 48 generates 0 if an odd state count value is received, and generates 1 if an even state count value is received. The 0 and 1 output from the modulo 2 unit 48 represent possible information bits (0 and 1) to be recovered by the decoder 300. In this example, given that the current state count is 5 (state 5), the modular 2 unit 48 generates 1 to the encoders 50A and 50B.

The first encoder 50A receives the bit (e.g., 1) from the modulo 2 unit 48 and the first possible previous state PS1 (e.g., state 2) from the state selector 46, and generates a first pair of theoretical coefficients TC0 and TC1 based on these inputs. The second encoder 50B receives the same bit (i.e., 1) from the modulo 2 unit 48 and the second previous state PS2 (e.g., state 130) from the state selector 46, and generates a second pair of theoretical coefficients TC0 and TC1 based on these inputs. This process is repeated for each pair of possible previous states selected by the state selector 46.

The first quantizer 52A receives the theoretical coefficients TC0 and TC1 from the first encoder 50A, and encoded data bits (e.g., corrupted coefficients CC0 and CC1) externally input to the decoder 300 for decoding. Similarly, the second quantizer 52B receives the theoretical coefficients TC0 and TC1 from the second encoder 50B and the corrupted coefficients CC0 and CC1. Each of the first and second quantizers 52A and 52B determines the conditional probability of each pair of the corrupted coefficients CC0 and CC1 based on the pairs of theoretical coefficients TC0 and TC1 generated from the corresponding encoder 50A or 50B, and then quantizes each conditional probability into a predetermined number of levels, e.g., 32 levels, 64 levels, etc., to generate quantized values. For example, if about 40 states among the entire 256 possible states are selected by the state selector 46 (which generates about 80 previous states corresponding to the 40 selected states), each quantizer 52A, 52B generates 80 quantized values per 40 selected states for each pair of corrupted coefficients CC0 and CC1. These quantized values indicate how well the pair of corrupted coefficients CC0 and CC1 matches each pair of the theoretical coefficients TC0 and TC1.

Whenever a quantized value is output from each of the quantizers 52A and 52B, each of the first and second adders 54A and 54B adds the current quantized value with a corresponding accumulated quantized value (i.e., ACP) stored in the first memory unit 60A.

Figure 5A:
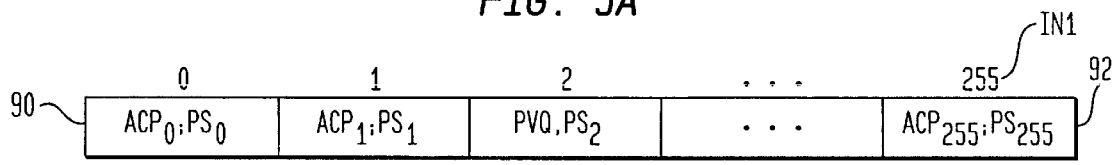
FIGS. 5A and 5B show examples of memory arrays of a first memory unit in the decoder of FIG. 3.
Figure 5B:
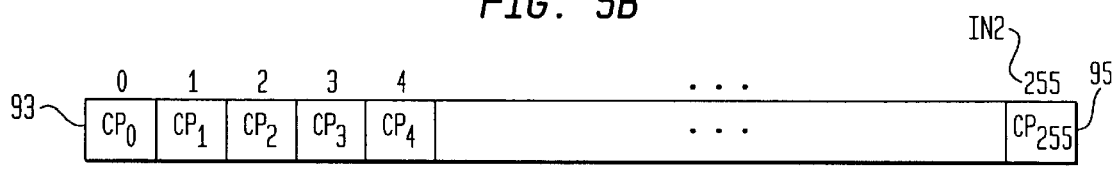

The data stored in the first memory unit 60A can be better understood in view of FIGS. 5A and 5B which show examples of memory arrays of the first memory unit 60A according to the present invention. As shown therein, the first memory unit 60A includes a first memory array 90 having a data area 92 referenced by an index IN1, and a second memory array 93 having data area 95 referenced by an index IN2. The index numbers of the indexes IN1 and IN2 represent the possible 256 (Index 0—Index 255) states such that the index number corresponds to the current state count. In the data area 92, a pair of ACP and previous states PS ($ACP_0$, $ACP_1$, $ACP_2$ ... $ACP_{255}$; $PS_0$, $PS_1$, $PS_2$, ..., $PS_{255}$) corresponding to Index 0—Index 255 are stored, where the PQV is stored in lieu of the ACP depending on the state selector 46. The second memory array 93 stores in its data area 95 the conditional probabilities ($CP_0$, $CP_1$, $CP_2$ ... $CP_{255}$) for each current state according to the index number. These values are output to the adders 54A and 54B in case the ACP of the current state has been just updated. Furthermore, the memory unit 60A includes other circuits for outputting the enable and disable signals ENS and DIS to the state selector 46 based on the data stored in the array 90. If the PQV is stored in the data area 92 corresponding to the index number matching the current state count, then the disable signal DIS is output to the state selector 46. Otherwise, the memory unit 60A outputs the enable signal ENS to the state selector 46.

For example, if the current state count is 5 (state 5) which generated state 2 and state 130 as the corresponding previous states, $ACP_2$ corresponding to index 2 (since previous state=2) and $ACP_{130}$ corresponding to index 130 (since the other previous state=130) are output from the first memory array 90 to the first and second adders 54A and 54B, respectively. The first and second adders 54A and 54B then outputs a pair of new ACPs to the maximum selector 58. The maximum selector 58 compares the two ACPs to each other, selects the greater of the two ACPs to generate the winning ACP, and replaces the ACP/PQV currently stored under index 5 (current state) in the first memory array 90 with the winning ACP. If the maximum selector 58 receives the PQVs prestored in the memories 75A and 75B of the state selector 46 for the current state count, the maximum selector 58 updates the ACP/PQV currently stored under index 5 with the PQV.

Since there are 256 possible states being contemplated in this example, the first memory array 90 is a 256×2 array, and the second memory array 93 is a 256×1 array. However, depending on the size of the encoder and the size of block data processed by the encoder, memory arrays having different sizes can be used for the first memory unit 60A. Once the data corresponding to all 256 index numbers have been generated and processed by the first memory unit 60A, the first memory unit 60A generates a control signal to the state counter 40 for starting the counting process from 0 again for the next pair of corrupted coefficients CC0 and CC1. In this example, this is carried out for 196 times since a block of encoded data being processed at one time has 196 information bits.

Figure 6:
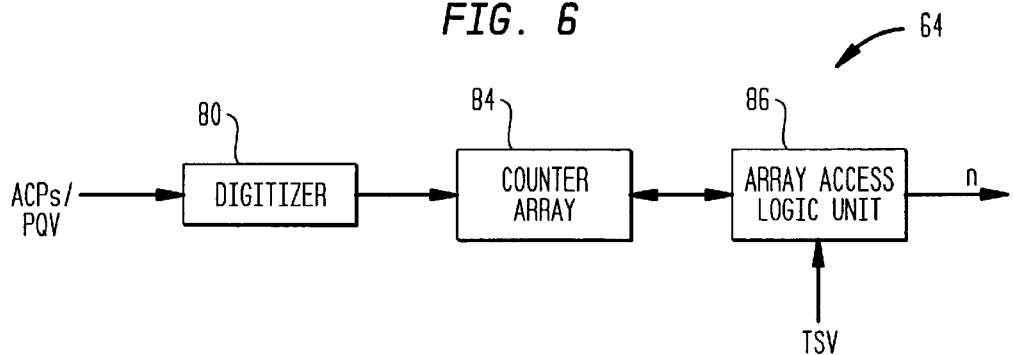
FIG. 6 shows a block diagram of a threshold estimator of the decoder of FIG. 3.

All 256 ACPs/PQV data stored in the data area 92 of the first memory unit 60 are sequentially output to the threshold estimator 64. FIG. 6 shows a detailed block diagram of the threshold estimator 64 of FIG. 3. As shown in FIG. 6, the threshold estimator 64 includes a digitizer 80 for digitizing or quantizing the 256 ACPs/PQV corresponding to 256 states into certain preset values, a counter array 84 for generating accumulated values using the ACPs/PQV, and an array access logic (AAL) unit 86 for accessing an index number from the counter array 84 based on a threshold setting value (TSV) input thereto and outputting the index number as a threshold value h. The AAL unit 86 can be implemented using a collection of logic gates known in the art.

Figure 7A:
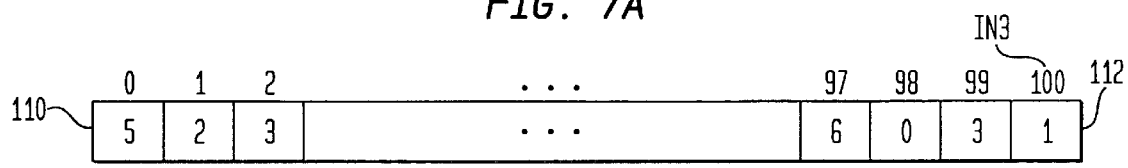
FIGS. 7A and 7B show examples of a counter array of the threshold estimator shown in FIG. 6.
Figure 7B:
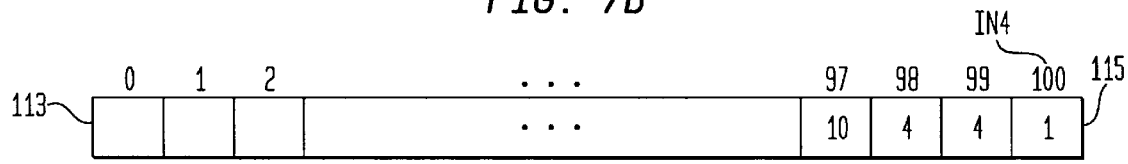

The digitizer 80 of the threshold estimator 64 receives 256 sets of data from the data area 92 of the first memory unit 60A, quantizes these data to a predetermined number of levels, and outputs the quantized values to the counter array 84. The counter array 84 includes a first counter array 110 and a second counter array 113 as shown in FIGS. 7A and 7B. The first counter array 110 includes a data area 112 for storing data corresponding to the index numbers of an index IN3. Similarly, the second counter array 113 includes a data area 115 for storing data corresponding to the index numbers of an index IN4. The index numbers of the indexes IN3 and IN4 correspond to a range of possible quantized values output from the digitizer 80. For example, if the possible quantized values which can be output from the digitizer 80 range from 0 to 100, then the index numbers. in the indexes IN3 and IN4 range from 0 to 100, sequentially, as shown in, e.g., FIG. 7A.

The first counter array 110 receives the 256 quantized values from the digitizer 80, and counts how many times each quantized value occurs in the 256 quantized values. For example, as shown in FIG. 7A, if there exists five quantized values of "0", two quantized values of "1", three quantized values of "2", ..., six quantized values of "97", zero quantized values of "98", three quantized values of "99", and one quantized values of "100", the first counter array 110 stores in the data area 112, values "5, 2, 3, ..., 6, 0, 3, 1" corresponding to the index numbers, "0, 1, 2, ..., 97, 98, 99, 100", respectively.

Then the second counter array 113 accesses the data stored in the data area 112 from the last index number, i.e., Index 100, and accumulates the data in the data area 115. For example, the second counter array 113 stores the value of "1" corresponding to Index 100 of the index IN3, the value of "4" (=1+3) corresponding to Index 99, the value of "4" (=4+0) corresponding to Index 98, the value of "10" (=4+6) corresponding to Index 97, etc. This process is continued until the data corresponding to index 0 of the first array 110 is accessed. Upon completion of this process, the second counter array 113 will have, in this example, the value of "256" stored in the data area 115 somewhere between Index 96 and Index 0 of the second counter array 113.

The AAL unit 86 receives a TSV from a user or an external source. The user can control the size of the second memory unit 60B by controlling the value of the TSV input to the AAL unit 86. The AAL unit 86 searches the data area 115 of the second counter array 113 for a data which matches the TSV. If there is no exact match, the AAL unit 86 looks for a data which is closest to the TSV. Once the matching data is found, the AAL unit 86 outputs the index number which corresponds to the matching data, and outputs this index number as the threshold value h to the comparator 62. For example, if TSV=9, then the AAL unit 86 selects Index 97 from the array 113 since its corresponding data "10" is the closest match to the TSV. As a result, in this example, h=97 is output to the comparator 62.

In addition to the threshold value h, the comparator 62 sequentially receives the data (ACP or PQV, PS) stored in the data area 92 of the first memory unit 60A for all 256 index numbers. As such data are sequentially received, the comparator 62 compares the threshold value h with the ACP/PQV received. If the received ACP/PQV is greater than or equal to the threshold value h, then the PS corresponding to the ACP/PQV passes to the second memory unit 60B. Otherwise, the received data are discarded and the next data corresponding to the next index number is compared and similarly processed.

FIGS. 8A and 8B show examples of memory arrays of the second memory unit 60B according to the present invention. As shown therein, the second memory unit 60B includes a first memory array 120 and a second array 122. In this example, based on the TSV and given that 196 information bits are to be decoded in one process, the first memory array 120 has a size of, e.g., 64×196, and the second memory array 122 has a size of, e.g., 256×2; however, memory arrays having various different sizes can be used depending on the TSV and/or other factors, e.g., data block size. Each column of the first memory array 120 represents one of the 196 information bits to be recovered.

An example of a method of storing data in the second memory unit 60B according to the present invention is as follows.

The first and second memory arrays. 120 and 122 are initialized with a predetermined number, e.g., −1, before any data is stored therein. That is, any data slot marked with −1 indicates that it is empty. The winning PSs, which correspond to the ACPs that passed the comparison test of the comparator 62, are sequentially output and stored in the first memory array 120 starting with the data slot (R0, C0) and down in the row direction (e.g., R1, R2, R3 . . . R263 in column C0). Each winning PS is associated with a particular current state, and the array 120 is processed one column at a time where a column represents one information bit to be recovered. That is, once all the winning PSs for one column have been processed, then all the winning PSs for the next adjacent column are processed, and so on, until the last column (column C195) is processed.

For example, assume column C3 of the array 120 is being processed and the comparator's outputs are: current state= 12, winning PS=6. Since column C3 (3=odd number) is an odd column, the second column CC1 of the second memory array 122 is searched. However, if the column of the first array 120 currently being processed is an even number, then the first column CC0 of the second memory array 122 will be searched initially.

Since the wining PS=6, row RR6 in column CC1 is located and the value stored therein is accessed. At this time, the index number (i.e., row number) of the second array 122 represents the winning PS. In the slot (RR6, CC1), the value of 3 is stored. This indicates where to store the winning PS of 6 in the first array 120. Since the value stored in row RR6 is 3, the winning PS of 6 is stored in row R3 (3=value stored in array 192), column C3 of the first array 120. Then, the value of 3 stored in the slot (RR3, CC1) is changed to −2 (as shown in FIG. 8C) to indicate occupancy, and since the current state=12, row RR12 in column CC0 is accessed. That is, at this time, the index of the second array 122 represents the current state count. In the slot (RR12, CC0), the same value of 3 is stored.

After processing column C3 of the array 120 as discussed above for all the winning ACPs, the next column C4 is processed. Since column C4 is an even column, column CC0 of the array 92 is initially accessed. If the comparator 62 outputs current state=24 and winning PS=12, then the value stored in the slot (RR12, CC0) is accessed. At this time, the index of the second array 122 represents the winning PS. Since the value of 3 is stored in the slot (RR12, CC0) as shown in FIG. 8C, the winning PS of 12 is stored in row R3 (3=value stored in the array 122), column C4 of the first array 120. Then the value of 3 in the slot (RR12, CC0) is changed to −2 indicating occupancy, and the value of 3 is stored in the slot (RR24, CC1) for the next column process. The above-described process is continued until the last column C195 of the first array 120 is completely processed. Then the decoding unit 68 accesses the winning PSs stored in the first array 120 from the last to the first column (C195 to C0) to recover the original information bits.

An operation of generating decoded information bits using the data stored in the first array 120 is as follows.

The decoding unit 68 searches the last column C195 of the array 120 for a value of zero since the last state of any data block is conventional known to be zero due to 8 tailing bits. Once a value of zero is found in row R0, then the value of zero is selected for the information bit position #195. Then the decoding unit 68 moves to the next left column and reads the value stored therein, i.e., to the slot (R1, C194). The decoding unit 68 moves to the next and reads each value it locates as long as the value of −1 is not detected. In this example, the value of −1 indicating that the slot is empty is located in the slot (R1, C194). Then, column R195 is searched from row R0 down to row R64 until another zero is found. By this process, another 0 is found in the slot (R2, C195). Then the decoding unit 68 moves to the next left column and reads the values, 128 and 64, until it locates −1 in column C192. Then column C193 is searched from row R0 down to R64 until another 64 is located. Another 64 is found in the slot (R5, C193). The decoding unit 68 moves to the next and reads the values, 32 and 144, until it locates −1. This process is continued until a value from column C0 is read.

Accordingly, the decoding unit 68 gathers 196 integers, and generates either 0 or 1 as the decoded data based on whether the integer is an odd or even number. For example, if the integer is an odd number, the decoding unit 68 outputs 1, and if the integer is an even number, the decoding unit 68 outputs 0, so that 196 information bits are output from the decoding unit 68 as decoded data. In this example, since the integers of 0, 128, 64, 32, 144 . . . were found in the array 120, the decoded data of 0, 0, 0, 0, 0 . . . are output from the decoding unit 68 as the decoded data.

According to the present decoding device and method, smaller memories can be used and a reduced-state search algorithm is performed, so as to decrease the cost of the device and method and to increase the operational speed of the device and method.

What is claimed is:

1. A device for decoding encoded data, comprising:
   a processing unit for selecting certain current states from all possible states for each of encoded data, generating accumulated conditional probabilities (ACPs) for the selected current states, comparing the ACPs with a threshold value, and storing previous states (PSs) associated with the ACPs based on comparison results; and
   a decoding unit for decoding the encoded data based on the stored previous states,
   wherein the selected certain current states are not selected based on pairs of complement current states.

2. The device of claim 1, wherein the processing unit comprises:
   a state selector for selecting the certain current states based on a control signal, and transmitting two previous states for each of the selected current states, or transmitting a predetermined quantized value (PQV) for each of non-selected current states.

3. The device of claim 2, wherein the PQV is a negative number.

4. The device of claim 2, wherein the processing unit compares the PQV with the threshold value for each of the non-selected current states, and discards the PQV based on this comparison result.

5. The device of claim 1, wherein the processing unit comprises:
   a state selector for selecting the certain current states based on a control signal, and transmitting two previous states for each of the selected current states.

6. The device of claim 1, wherein the processing unit comprises:
   a state selector for selecting the certain current states based on a control signal, and transmitting a predetermined quantized value (PQV) for each of the non-selected current states.

7. The device of claim 1, wherein the processing unit comprises:
   a plurality of encoding units for generating two conditional probabilities for each of the selected current states based on each of the encoded data and coefficient data.

8. The device of claim 7, wherein the processing unit further comprises:
   a plurality of adders for adding each of the conditional probabilities output from the encoding units with a corresponding ACP to generate a pair of new ACPs for each of the selected current states.

9. The device of claim 8, wherein the processing unit further comprises:
   a maximum selector for comparing two ACPs in each pair of the new ACPs for the selected current states to generate a winning ACP and an associated winning PS, outputting the winning ACPs and the associated winning PSs for the selected current states, and outputting a predetermined quantized value (PQV) and associated winning PSs for non-selected current states.

10. The device of claim 9, wherein the processing unit further comprises:
    a first memory unit including a memory array having a plurality of data slots, each data slot assigned to an index number, the index number representing a current state value, wherein the winning ACP or the PQV, and the associated winning PS for each of the possible states are stored in the memory array of the first memory unit.

11. The device of claim 10, wherein a total number of different index numbers assigned to the memory array corresponds to a total number of all possible states.

12. The device of claim 10, wherein the processing unit further comprises:
    a threshold estimator for generating the threshold value based on a user input and based on the winning ACPs or the PQV stored in the memory array;
    a comparator for comparing the winning ACPs or the PQV with the threshold value, outputting the winning PSs associated with the winning ACPs based on results of the comparison, and discarding other winning PSs based on the results of the comparison; and
    a second memory unit for storing outputs of the comparator.

13. The device of claim 12, wherein in the comparator, if the winning ACP output from the first memory unit is greater than or equal to the threshold value, the comparator stores said winning ACP in the second memory unit, and if said wining ACP is less than the threshold value, the comparator discards said winning ACP.

14. The device of claim 12, wherein the threshold estimator comprises:
    a digitizer for quantizing the winning ACPs and the PQV output from the memory array of the first memory unit;
    a counter array for generating accumulated values based on the winning ACPs and the PQV; and
    a logic unit for detecting one of the accumulated values that corresponds to the user input, and outputting an index number of the counter array that corresponds to the detected one of the accumulated values as the threshold value.

15. The device of claim 12, wherein the second memory unit comprises:
    a first memory array for sequentially storing the winning PSs output from the comparator; and
    a second memory array having a plurality of index numbers, each index number representing a previous state number or a current state number, and storing positional information of the first memory array under the index numbers of the second memory array associated the winning PSs output from the comparator.

16. The device of claim 12, wherein the first memory array of the second memory unit is larger in size than the second memory array of the second memory unit.

17. The device of claim 1, wherein the decoding unit selectively obtains a winning PS from the stored PSs for each of the encoded data, and generates either 0 or 1 based the selectively obtained wining PSs.

18. The device of claim 17, wherein the decoding unit outputs 0 if the selectively obtained winning PS is an even number, and 1 if the selectively obtained winning PS is an odd number.

19. The device of claim 1, wherein the processing unit comprises:
    a state counter for sequentially counting the all possible states to generate a current state count value; and
    a previous state locator for calculating two previous states associated with each current state count value to generate the ACPs.

20. A method for decoding encoded data, comprising the steps of:
    selecting certain current states from all possible states for each of the encoded data, generating accumulated conditional probabilities (ACPs) for the selected current states, comparing the ACPs with a threshold value, and storing previous states (PSs) associated with the ACPs based on results from the comparison; and decoding the encoded data based on the stored previous states, wherein the selected certain current states are not selected based on pairs of complement current states.

21. The method of claim 20, wherein the selecting step selects the certain current states based on a control signal and transmits two previous states for each of the selected current states.

22. The method of claim 20, wherein the selecting step selects the certain current states based on a control signal and transmits a predetermined quantized value (PQV) for each of the non-selected current states.

23. The method of claim 20, wherein the selecting step selects the certain current states based on a control signal, and transmits two previous states for each of the selected current states or transmits a predetermined quantized value (PQV) for each of non-selected current states.

24. The method of claim 23, wherein in the selecting step, the PQV is a negative number.

25. The method of claim 23, wherein the selecting step compares the PQV with the threshold value for each of the non-selected current states, and discards the PQV based on this comparison result.

26. The method of claim 20, wherein the selecting step comprises:

generating two conditional probabilities for each of the selected current states based on each of the encoded data and coefficient data.

27. The method of claim 26, wherein the selecting step furthers comprises:

adding each of the generated conditional probabilities with a corresponding ACP to generate a pair of new ACPs for each of the selected current states.

28. The method of claim 27, wherein the selecting step further includes:

comparing two ACPs in each pair of the new ACPs for the selected current states to generate a winning ACP and an associated wining PS for each of the selected current states;

outputting the winning ACPs and the associated winning PSs for the selected current states; and outputting a predetermined quantized value (PQV) and associated winning PSs for non-selected current states.

29. The method of claim 28, wherein the selecting step further comprises:

storing, in a memory array of a first memory unit, the winning ACP or the PQV, and the associated winning PS for each of the possible states, the memory array including a plurality of data slots, each data slot assigned to an index number, the index number representing a current state value.

30. The method of claim 29, wherein in the storing step, a total number of different index numbers assigned to the memory array of the first memory unit corresponds to a total number of all possible states.

31. The method of claim 30, wherein the selecting step further comprises:

generating the threshold value based on a user input and the winning ACPs or the PQV stored in the memory array;

comparing, using a comparator, the winning ACPs or the PQV with the threshold value, and outputting the winning PSs associated with the winning ACPs based on results from said comparing step, and discarding other winning PSs based on the results from said comparing step; and storing outputs of the comparator in a second memory unit.

32. The method of claim 31, wherein in said comparing step, if the winning ACP output from the first memory unit is greater than or equal to the threshold value, said winning ACP is stored in the second memory unit, and if said wining ACP is less than the threshold value, said winning ACP is discarded.

33. The method of claim 31, wherein the step of generating a threshold value comprises:

quantizing the winning ACPs and the PQV output from the memory array of the first memory unit;

generating, using a counter array, accumulated values based on the quantized winning ACPs and PQV;

detecting one of the accumulated values that corresponds to the user input; and outputting an index number of the counter array that corresponds to the detected one of the accumulated values as the threshold value.

34. The method of claim 31, wherein in the step of storing outputs of the comparator, the second memory unit comprises first and second memory arrays with a plurality of index numbers assigned thereto, each index number of the second memory array representing a previous state number or a current state number.

35. The method of claim 34, wherein the step of storing outputs of the comparator comprises:

sequentially storing, in the first memory array of the second memory unit, the winning PSs output from the comparator; and storing, in the second memory array of the second memory unit, positional information of the first memory array under the index numbers of the second memory array associated with the winning PSs output from the comparator.

36. The method of claim 20, wherein the decoding step selectively. obtains a winning PS from the stored PSs for each of the encoded data, and generates either 0 or 1 based the selectively obtained winning PSs.

37. The method of claim 36, wherein the decoding step outputs 0 if the selectively obtained winning PS is an even number, and 1 if the selectively obtained winning PS is an odd number.

38. The method of claim 20, wherein the selecting step comprises:

sequentially counting the all possible states to generate a current state count value; and calculating two previous states associated with each current state count value to generate the ACPs.

39. A computer program embodied on a computer-readable medium for generating data used to output decoded data, comprising:

a code segment containing previous states (PSs) associated with a first set of current states, the first set of current states being selected based on results from. comparing accumulated conditional probabilities (ACPS) of a second set of current states with a threshold value, the second set of current states being selected from all possible states based on a control signal, wherein the first set of current states and the second set of current states are not selected based on pairs of complement states.

40. The computer program of claim 39, wherein the PSs contained in the code segment are sequentially output and stored in a first memory array.

41. The computer program of claim 40, wherein positional information of the first memory array in which the PSs are stored is stored in a second memory array.

42. The computer program of claim 40, wherein from each column of the first memory array, one of the PSs stored therein is output and converted into either 0 or 1 bit.

43. The computer program of claim 42, wherein the 0 or 1 bit is sequentially output as the decoded data.

44. A data signal comprising:

a signal segment containing previous states (PSs) associated with a first set of current states, the first set of current states being selected based on results from comparing accumulated conditional probabilities (ACPs) of a second set of current states with-a threshold value, the second set of current states being selected from all possible states based on a control signal, wherein the first set of current states and the second set of current states are not selected based on pairs of complement states.

45. The data signal of claim 44, wherein the PSs contained in the signal segment are sequentially output and stored in a first memory array.

46. The data signal of claim 45, wherein positional information of the first memory array in which the PSs are stored is stored in a second memory array.

47. The data signal of claim 45, wherein from each column of the first memory array, one of the PSs stored therein is output and converted into either 0 or 1 bit.

48. The data signal of claim 47, wherein the 0 or 1 bit is sequentially output as decoded data.

49. The data signal of claim 44, wherein the data signal is embodied in a carrier wave.

* * * * *